(12) United States Patent  
Lin et al.

(10) Patent No.: US 7,960,807 B2
(45) Date of Patent: Jun. 14, 2011

(54) AMBIENT LIGHT DETECTORS USING CONVENTIONAL CMOS IMAGE SENSOR PROCESS

(75) Inventors: Xijian Lin, Fremont, CA (US); Phillip J. Benzel, Pleasanton, CA (US); Bjoy Santos, San Bruno, CA (US); Joy Jones, Fremont, CA (US)

(73) Assignee: Intersil Americas Inc., Milpitas, CA (US)

( * ) Notice: Subject to any disclaimer, the term of this patent is extended or adjusted under 35 U.S.C. 154(b) by 348 days.

(21) Appl. No.: 11/686,311

(22) Filed: Mar. 14, 2007

(65) Prior Publication Data
US 2008/0191298 A1    Aug. 14, 2008

Related U.S. Application Data

(60) Provisional application No. 60/889,035, filed on Feb. 9, 2007.

(51) Int. Cl.
*H01L 31/0232* (2006.01)
(52) U.S. Cl. ........ 257/440; 257/291; 257/294; 257/432; 257/E31.121; 257/E31.123; 257/E31.127; 250/214 AL; 250/226; 348/273; 348/274
(58) Field of Classification Search ............... 257/291, 257/294, 432, 440, 435, E31.121, E31.123, 257/E31.127; 250/226, 214 AL; 348/273, 348/274; 438/273, 274
See application file for complete search history.

(56) References Cited

U.S. PATENT DOCUMENTS

| | | | |
|---|---|---|---|
| 4,096,512 A | 6/1978 | Polinsky | |
| 5,130,775 A | 7/1992 | Maeda et al. | |
| 5,801,373 A | * | 9/1998 | Oozu et al. ............ 250/208.1 |
| 6,157,035 A | 12/2000 | Kuijk et al. | |
| 6,218,719 B1 | 4/2001 | Tsang | |

(Continued)

FOREIGN PATENT DOCUMENTS

EP    97870061.5    4/1997

(Continued)

OTHER PUBLICATIONS

Kuijk et al., "Spatially Modulated Light Detector in CMOS with Sense-Amplifier Receiver Operating at 180 Mb/s for Optical Data Link Applications and Parallel Optical Interconnects Between Chips," IEEE J. Selected Topics Quantum Electronics 4(6):1040-1045 (1998).

(Continued)

*Primary Examiner* — Jerome Jackson, Jr.
*Assistant Examiner* — Yu Chen
(74) *Attorney, Agent, or Firm* — Fiesler Meyer LLP

(57) ABSTRACT

A CMOS light detector configured to detect specific wavelengths of light includes a first sensor and a second sensor. The first sensor includes CMOS photocells that are covered by a colored filter layer of a first color that has a first transmittance that allows both light of the specific wavelengths and light of other wavelengths to pass. The second sensor including further CMOS photocells, at least some of which are covered by both a colored filter layer of the first color and a colored filter layer of a second color, stacked one above the other in either order, where the colored filter layer of the second color has a second transmittance that allows light of the other wavelengths to pass. The first sensor produces a first photocurrent, and the second sensor produces a second photocurrent, when light including both the specific and other wavelengths is incident upon the detector. A differential photocurrent, produced by determining a difference between the first and second photocurrents, has a spectral response with at least part of the light of other wavelengths cancelled.

14 Claims, 10 Drawing Sheets

U.S. PATENT DOCUMENTS

| | | | |
|---|---|---|---|
| 6,359,293 | B1 | 3/2002 | Woodward |
| 6,596,981 | B1 | 7/2003 | Aswell et al. |
| 6,724,063 | B2 | 4/2004 | Kuhara et al. |
| 6,825,470 | B1* | 11/2004 | Bawolek et al. ......... 250/339.05 |
| 6,998,207 | B2 | 2/2006 | Yaung |
| 7,163,832 | B2 | 1/2007 | Kim |
| 7,394,059 | B2* | 7/2008 | Fukuyoshi et al. ........... 250/226 |
| 2002/0047174 | A1 | 4/2002 | De Pauw et al. |
| 2004/0089790 | A1 | 5/2004 | Rubin et al. |
| 2005/0133690 | A1 | 6/2005 | Higashitsutsumi |
| 2005/0133693 | A1* | 6/2005 | Fouquet et al. ........... 250/214 R |

FOREIGN PATENT DOCUMENTS

| | | |
|---|---|---|
| EP | 0 875 939 A1 | 4/1998 |
| EP | 0 877 426 A1 | 11/1998 |
| EP | 1 073 125 A2 | 1/2001 |
| WO | WO 99/50682 | 10/1999 |
| WO | WO 2006003807 A1 * | 1/2006 |

OTHER PUBLICATIONS

Lalanne and Rodier, "CMOS Photidiodes Based on Vertical P-N-P Junctions,"Institut d'Optique Théorique et Appliquée, pp. 1-8, CNRS, BP 147, F91 403 Orsay Cedex, France, http://ipdps.cc.gatech.edu/1997/wocs/lalanne.pdf.

Rooman et al., "Asynchronous 250-Mb/s Optical Receivers with Integrated Detector in Standard CMOS Technology for Optocoupler Applications," IEEE J. Solid-State Circuits 35(7):953-958 (2000).

Woodward et al., "1-Gb/s Integrated Optical Detectors and Receivers in Commercial CMOS Technologies," IEEE J. Selected Topics Quantum Electronics 5(2):146-158 (1999).

Zimmermann, ed., "Integrated Silicon Opto-electronics," Photonics pp. 4-6, 15-22, Springer (2000).

Zhang et al., "Performance of a CMOS Compatible Lateral Bipolar Photodetector on SOI Substrate," IEEE Electron Device Letts. 19(11):435-437 (1998).

"Photodetector Elements," 3 pp., http://www.iee.et.tu-dresden.de/iee/eb/analog/papers/mirror/visionchip.../photodetector.htm, printed Oct. 24, 2002.

TSL2550, "Ambient Light Sensor with SMBus Interface,"pp. 1-18, TAOS Inc., (2005).

ISL29001, "Light to Digital Sensor," pp. 1-10, Intersil Americas Inc. (2005).

S9066-01, S9067-01, "Spectral Response Close to Human Eye Sensitivity," pp. 1-2, Hamamatsu Photonics K.K., (Mar. 2005).

International Search Report for PCT/US03/33301 (mailed May 18, 2005).

"TSMC Begins Volume Production of CMOS Image Sensors,"Digital Photography Review, http://www.dpreview.com/news/0005/0051503tsmc_cmos.asp, 2 pages (May 16, 2000).

"Tower Semiconductor Unveils Advanced CMOS Image Sensor Manufacturing Technology Services with Color Filter and Stitching Capabilities," Tower Semiconductor Ltd., http://www.towersemi.com/pages/news_archive_content.asp?intGlobalId=176&intLevel=0&intDeep=4, 3 pages (Aug. 2, 1999).

Miller, Harris R., "Color Filter Array for CCD and CMOS Image Sensors Using a Chemically Amplified, Thermally Cured, Pre-Dyed, Positive-Tone Photoresist for 365 nm Lithography," CAT.INIST, http://cat.inist.fr/?aModele=afficheN&cpsidt=17387091, 2 pages (2006).

"Colour Filters for CMOS Sensors—Tower Semiconductor's Colur Filter Deposition Process—Product Information," Miller Freeman UK Ltd., http://findarticles.com/p/articles/mi_m0WVI/is_1999_March_15/ai_54143252, 1 page (Mar. 15, 1999).

"CMOS Pixel Structure," Micron Technology, Inc., http://www.micron.com/innovations/imaging/pixel, 2 pages (2006).

"An Introduction to CMOS Image Sensor Technology," CMOS Primer, http://www.siliconimaging.com/ARTICLES/CMOS%20-PRIMER.htm, 15 pages (accessed Jan. 24, 2007).

International Search Report for International Application No. PCT/US2008/051450 (May 20, 2008).

* cited by examiner

AMBIENT LIGHT DETECTORS USING CONVENTIONAL CMOS IMAGE SENSOR PROCESS

PRIORITY CLAIM

This application claims priority under 35 U.S.C. 119(e) to U.S. Provisional Patent Application No. 60/889,035, filed Feb. 9, 2007, which is incorporated herein by reference.

FIELD OF THE INVENTION

The present invention relates to light detectors, and in specific embodiments, to ambient light detectors.

BACKGROUND

There has recently been an increased interest in the use of ambient light detectors, e.g., for use as energy saving light sensors for displays, for controlling backlighting in portable devices such as cell phones and laptop computers, and for various other types of light level measurement and management. Ambient light detectors are used to reduce overall display-system power consumption and to increase Liquid Crystal Display (LCD) lifespan by detecting bright and dim ambient light conditions as a means of controlling display and/or keypad backlighting.

Without ambient light detectors, LCD display backlighting control is typically done manually whereby users will increase the intensity of the LCD as the ambient environment becomes brighter. With the use of ambient light detectors, users adjust the LCD brightness to their preference, and as the ambient environment changes, the display brightness adjusts to make the display appear uniform at the same perceived level; this results in battery life being extended, user strain being reduced, and LCD lifespan being extended. Similarly, without ambient light detectors, control of the keypad backlight is very much dependent on the user and software. For example, keypad backlight can be turned on for 10 second by a trigger which can be triggered by pressing the keypad, or a timer. With the use of ambient light detectors, keypad backlighting can be turned on only when the ambient environment is dim, which will result in longer battery life.

In order to achieve better ambient light sensing, ambient light detectors should have a spectral response close to the human eye response and have excellent Infrared (IR) noise suppression. Currently, most companies use proprietary processes or special optical packages to build ambient light detectors with human-eye response and IR rejection.

For various reasons, there is an interest implementing ambient light detectors using complementary-metal-oxide semiconductor (CMOS) technology. First, CMOS circuitry is generally less expensive than other technologies, such as Gallium Arsenide or bipolar silicon technologies. Further, CMOS circuitry generally dissipates less power than other technologies. Additionally, CMOS photodetectors can be formed on the same substrate as other low power CMOS devices, such as metal-oxide semiconductor field effect transistors (MOSFETs).

FIG. 1A shows a cross section of an exemplary conventional CMOS light sensor 102, available in a conventional CMOS image sensor process. The light sensor 102 is essentially a single CMOS photodiode, also referred to as a CMOS photodetector, or a CMOS photocell. The light sensor 102 includes an $N^+$ region 104, which is heavily doped, a N- region 106 which is lightly doped and a $P^-$ region 108 (which can be a $P^-$ epitaxial layer), which is lightly doped. All of the above can be formed on a $P^+$ or $P^{++}$ substrate (not shown), which is heavily doped.

Still referring to FIG. 1A, the $N^-$ region 106 and $P^-$ region 108 form a PN junction, and more specifically, a $N^{31}/P^-$ junction. This PN junction is reversed biased, e.g., using a voltage source (not shown), which causes a depletion region (not shown) around the PN junction. When light 112 is incident on the CMOS photodetector 102, electron-hole pairs are produced in and near the diode depletion region. Electrons are immediately pulled toward $N^-$ region 106, while holes get pushed down toward $P^-$ region 108. These electrons (also referred to as carriers) are captured in $N^+$ region 104 and produce a measurable photocurrent, which can be detected, e.g., using a current detector (not shown). This photocurrent is indicative of the intensity of the light 112, thereby enabling the photodetector to be used as a light sensor. It is noted that FIG. 1A and the remaining FIGS. that illustrate light sensors are not drawn to scale.

A problem with such a conventional CMOS photodetector is that it detects both visible light and non-visible light, such as Infrared (IR) light. This can be appreciated from the graph in FIG. 1B, which illustrates an exemplary spectral response 120 of a human eye (as defined by International Commision on Illumination (CIE)), and a spectral response 122 of a conventional CMOS photodetector (e.g., 102) when housed in a low-cost transparent optical package. As can be appreciated from response curve 120, the human eye does not detect IR light, which starts at about 750 nm. In contrast, a conventional CMOS photodetector detects a significant amount of IR light, as can be appreciated from response curve 122. Thus, the spectral response 122 of a conventional photodetector significantly differs from the spectral response 120 of a human eye. This is especially true when the light 112 is produced by an incandescent light, which produces large amounts of IR light. Accordingly, the use of conventional CMOS photodetectors for adjusting backlighting, or the like, will provide for significantly less than optimal adjustments.

There is a desire to provide CMOS light detectors that have a spectral response closer to that of a human eye. Such light detectors can be used, e.g., for appropriately adjusting the backlighting of displays, or the like.

SUMMARY

Embodiments of the preset invention are directed to CMOS light detectors that are configured to detect specific wavelengths of light, and methods of making the same. For example, specific embodiments of the present invention are directed to CMOS ambient light detectors that can detect visible light, yet essentially suppress or filter out IR light.

In accordance with specific embodiments, a CMOS light detector configured to detect specific wavelengths of light includes a first sensor and a second sensor. The first sensor includes CMOS photocells that are covered by a colored filter layer of a first color that has a first transmittance that allows both light of the specific wavelengths and light of other wavelengths to pass. The second sensor including further CMOS photocells, at least some of which are covered by both a colored filter layer of the first color and a colored filter layer of a second color, stacked one above the other in either order, where the colored filter layer of the second color has a second transmittance that allows light of the other wavelengths to pass. The first sensor produces a first photocurrent, and the second sensor produces a second photocurrent, when light including both the specific and other wavelengths is incident upon the detector. A differential photocurrent, produced by determining a difference between the first and second photocurrents, has a spectral response with at least part of the light of other wavelengths cancelled.

In specific embodiments, at least some of the CMOS photocells of the second sensor are covered by both a colored filter layer of the first color and a colored filter layer of a third color, stacked one above the other in either order, where the colored filter layer of the third color has a third transmittance that allows the light of the other frequencies to pass. This third transmittance is different than the second transmittance.

Where the CMOS light detector is intended to be an ambient light detector, the specific wavelengths to be detected include visible light wavelengths, and the other wavelengths of light include IR light wavelengths (e.g., from about 750 nm to about 1100 nm). In such a detector, the first sensor can include CMOS photocells that are covered by a green filter layer that allows both visible and IR light to pass. The second sensor can include further CMOS photocells, at least some of which are covered by both a green filter layer and a red filter layer, stacked one above the other in either order, where the red filter layer allows IR light to pass. In specific embodiments, some of the other CMOS photocells of the second sensor are covered by both a green filter layer and a black filter layer, stacked one above the other in either order, where the black filter layer also allows IR light to pass, yet has a different transmittance than the red filter layer, allowing for further optimization of a differential spectral response.

In specific embodiments, the green filter layer has a first thickness, the red filter layer has a second thickness, and the black filter layer has a third thickness, and the first, second and third thicknesses are selected such that the differential response is similar to that of a human eye. More generally, thicknesses of different colored filter layers can be optimized to achieve a desired spectral response.

In specific embodiments, X of the CMOS photocells are covered by the green filter layer (but no other colored filter layer), Y of the CMOS photocells are covered by both the green filter layer and the red filter layer, and Z of the CMOS photocells are covered by both the green filter layer and the black filter layer, and X, Y and Z are selected such that the differential response is similar to that of a human eye. More generally, the quantity of CMOS photocells covered by a single colored filter layer and/or stacked colored filter layers, can be optimized to achieve a desired spectral response.

Embodiments of the present invention are also directed to methods for providing light detectors. For example, a method for providing an ambient light detector can include providing a plurality of CMOS photocells, covering the CMOS photocells with a colored filter layer of a first color that has a first transmittance that allows both visible and IR light to pass, and covering some of the CMOS photocells with both a colored filter layer of the first color and a colored filter layer of a second color, stacked one above the other in either order, where the colored filter layer of the second color has a second transmittance that allows IR light to pass. Such a method can also include configuring the CMOS photocells such that a first photocurrent is produced by those photocells that are covered by the colored filter layer of the first color but no other colored filter layer, and a second photocurrent is produced by those photocells that are covered by both the colored filter layer of the first color and the colored filter layer of the second color, wherein a differential photocurrent, produced by determining a difference between the first and second photocurrents, has a spectral response with a significant part of the IR light cancelled. This method can also include covering at least some other of the CMOS photocells with both a colored filter layer of the first color and a colored filter layer of a third color, stacked one above the other in either order, where the colored filter layer of the third color has a third transmittance that allows IR light to pass, and configuring these other CMOS photocells so they contribute to the second photocurrent.

Embodiments of the present invention also include optimizing thicknesses of the various filter layers such that the differential response is similar to that of a human eye, or more generally, optimized to a desired response.

Embodiments of the present invention also include optimizing X, Y and Z such that the differential response is similar to that of a human eye, where X is indicative of a percentage of the CMOS photocells that are covered by the green filter layer but no other colored filter layer, Y is indicative of a percentage of the CMOS photocells that are covered by both the green filter layer and the red filter layer, and Z is indicative of a percentage of the CMOS photocells that are covered by both the green filter layer and the black filter layer.

Embodiments of the present invention also include optimizing thicknesses of colored filter layers, as well as how many CMOS photocells are covered by which colored filter layer and/or stacked colored filter layers, to achieve a desired response.

In accordance with specific embodiments, the colored filter layers are deposited over CMOS photocells at a backend of a CMOS process. The CMOS process can be, e.g., a CMOS image sensor process.

Further embodiments, and the features, aspects, and advantages of the present invention will become more apparent from the detailed description set forth below, the drawings and the claims.

DETAILED DESCRIPTION

Figure 2:
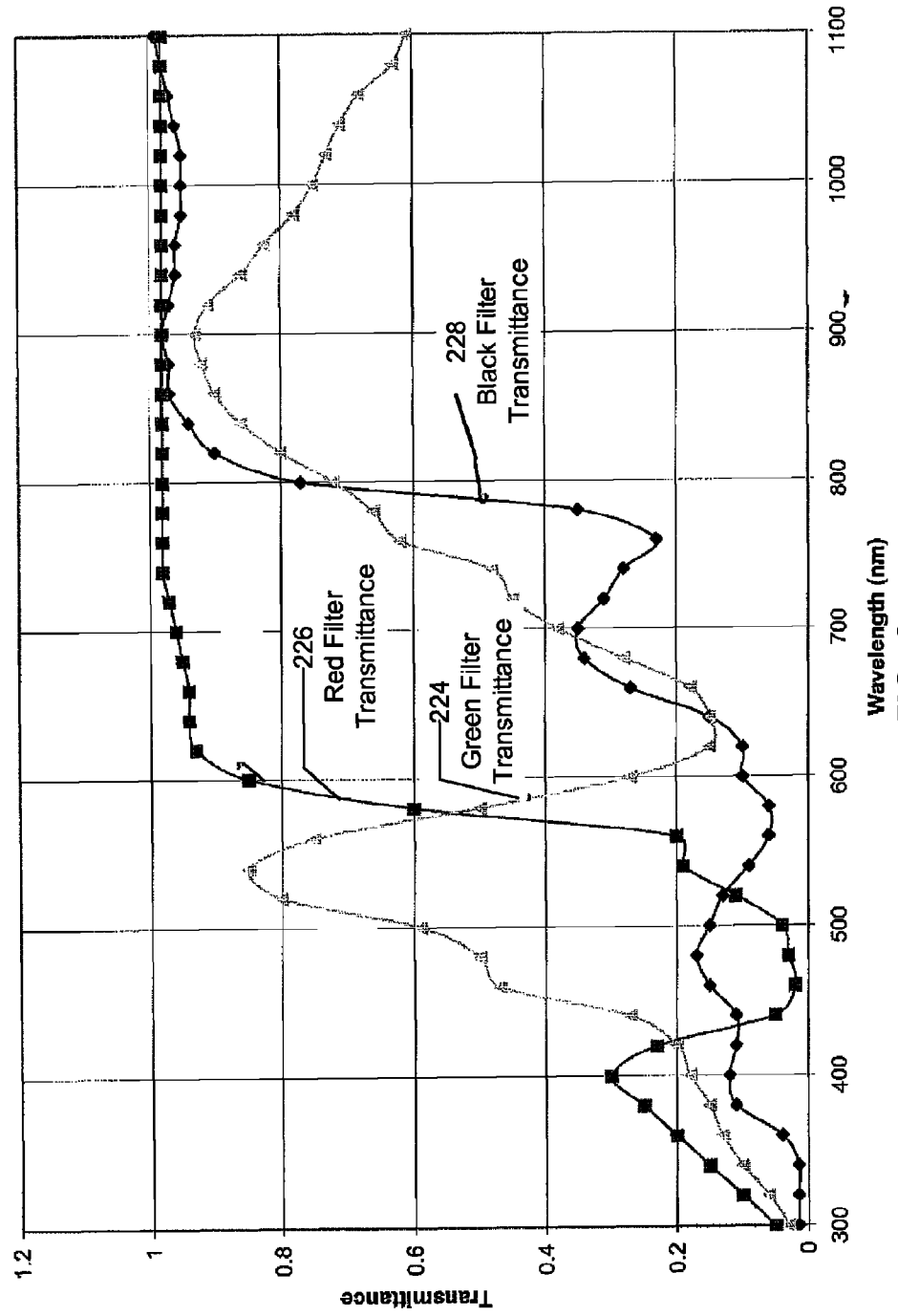
FIG. 2 is a graph that illustrates the transmittance of a green filter, a red filter and a black filter that can be made during CMOS wafer processing.

Specific embodiments of the present invention describe below provide for low-cost ambient light detectors with human-eye response and IR rejection based on a conventional complementary-metal-oxide-semiconductor (CMOS) image sensor process using readily available color filter technology FIG. 2 shows the transmittance of the green, red and black filters that can be provided using readily available CMOS image sensor process technology. Specifically, curve 224 illustrates an exemplary transmittance of a green filter available in a CMOS image sensor process; curve 226 illustrates an exemplary transmittance of a red filter available in a CMOS image sensor process; and curve 228 illustrates an exemplary transmittance of a black filter available in a CMOS image sensor process. These filters are thin films made during one of the latter (and possibly last) stage of wafer processing, and are typically available from most foundries today. Such filters, also referred to as colored filter layers, can be applied, e.g., during a deposition process, such as, but not limited to a spin coat process. The various colored filter layers can be achieved, e.g., using various inorganic oxide stacks. Such oxide stacks are typically produced through depositions using a low temperature chemical vapor deposition (CVD). Use of low temperature are preferred here, because these filter layers are formed above a passivation layer. Alternatively, the colored filter layers can be organic layers that develop similar to a photoresist material. Such processes are typically backend CMOS processes.

Figure 3A:
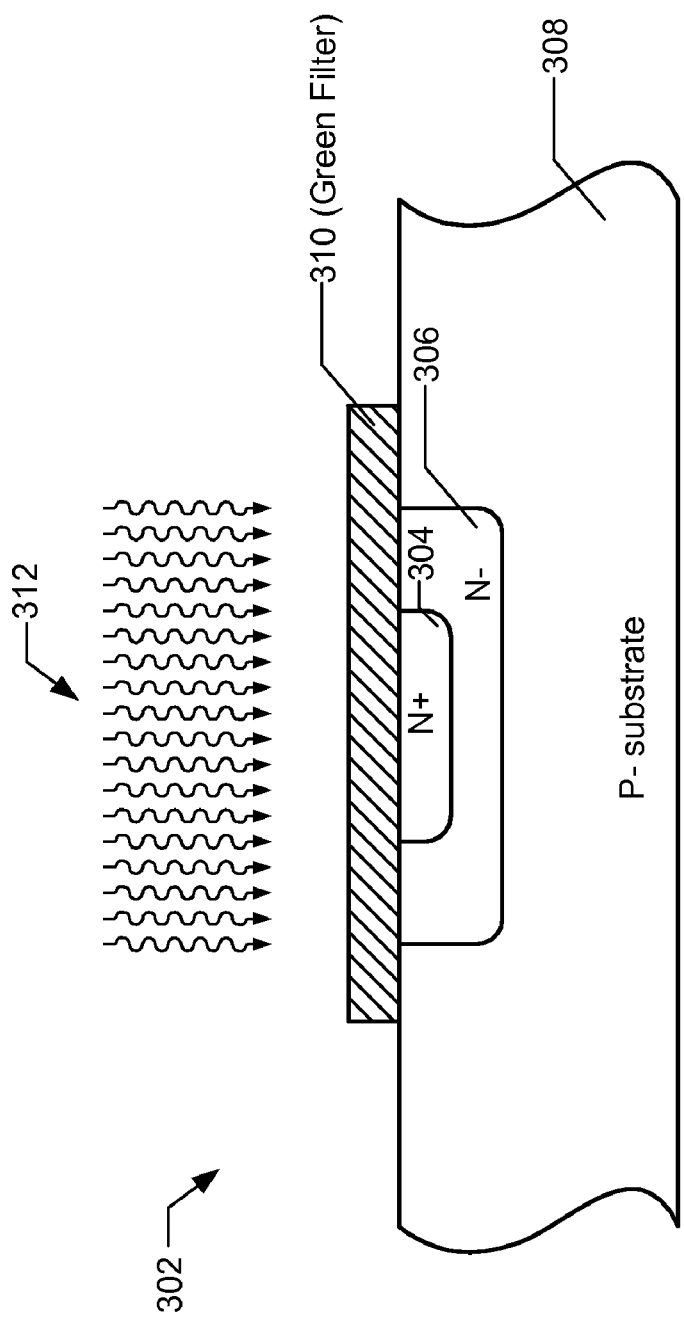
FIG. 3A is a cross-section of a CMOS light sensor, similar to that of FIG. 1A, covered by a green filter that is made during CMOS wafer processing.
Figure 3B:
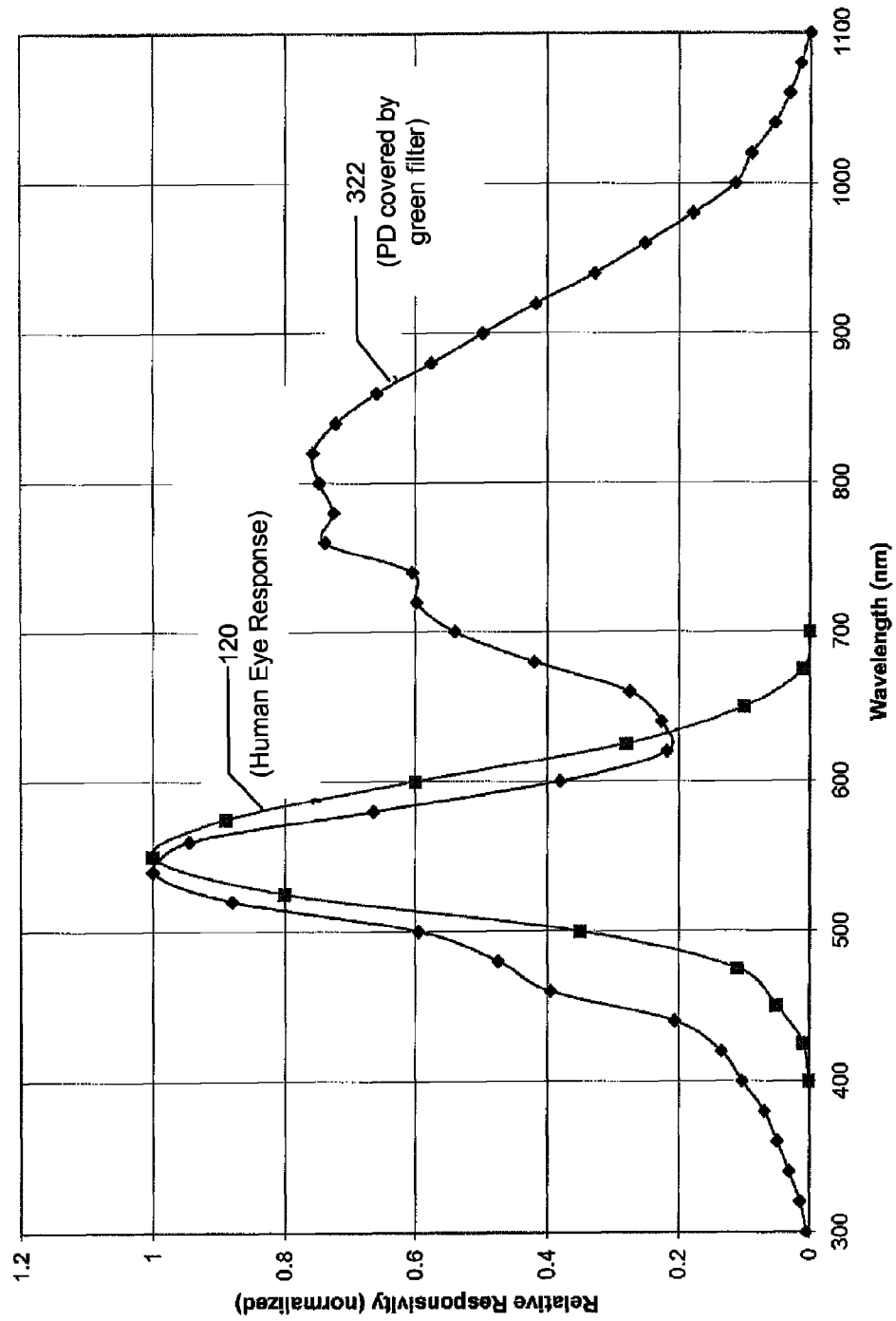
FIG. 3B is a graph that shows the spectral response of a human eye and the spectral response of the green filter covered CMOS light sensor of FIG. 3A.

FIG. 3A shows the cross-section of a CMOS sensor 302, which includes a CMOS photocell (similar to 102) covered by a green filter 310. Referring to FIG. 3B, curve 322 shows the measured responsivity of the sensor 302 and the CIE curve 120. The measured responsivity can also be derived from Equation 1 below.

$$R\lambda(\text{sensor}) = R\lambda(\text{photo diode}) * Tr,\lambda(\text{green}) \quad \text{(Eq. 1)}$$

where, $R\lambda(\text{sensor})$ is the sensor's responsivity at wavelength $\lambda$, $R\lambda(\text{photo diode})$ is the photo diode's responsivity (as in FIG. 1B), and $Tr,\lambda(\text{green})$ is the green filter's transmittance (as in FIG. 2).

Here, the reflection between the CMOS photocell and the green filter 310 is negligible, and therefore is neglected. As shown in FIG. 3B, the sensor 302 has a spectral response curve 322 somewhat close to the CIE human eye curve 120 in visible light from about 450 nm to about 650nm. Unfortunately, the sensor 302 has a second hump of the responsivity in the range from bout 700 nm to about 1100 nm, which is due to the inability of the green filter 310 to block IR light. This response is very typical in filters of this type, and thus the sensor 302 has very poor IR rejection.

Figure 4A:
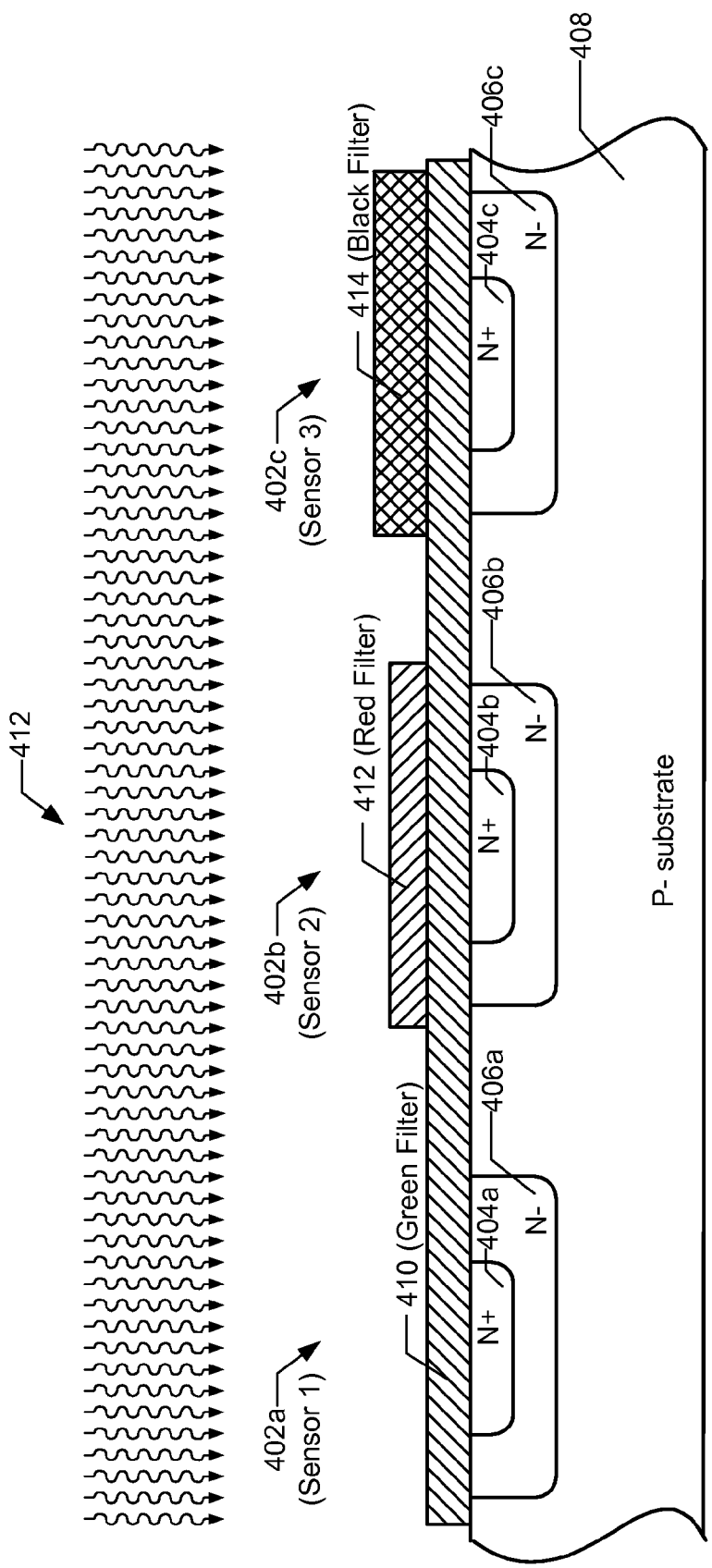
FIG. 4A is a cross-section of three CMOS light sensors, each covered by one or more colored filter layer made during CMOS wafer processing.

FIG. 4A shows the structures of three different sensors 402a, 402b and 402c. The first sensor 402a is a standard CMOS photocell (similar to 102) covered by a green filter layer 410; the second sensor 402b is a CMOS photocell (similar to 102) that is covered by both a green filter layer 410 and a red filter layer 412 stacked above one another; and the third sensor 402c is a CMOS photocell (similar to 102) which is covered by both a green filter layer 410 and a black filter layer 414 stacked above one another. In accordance with an embodiment, all of the filter covered photocells can be substantially the same size, but can differ in the number placed in the final array.

Figure 4B:
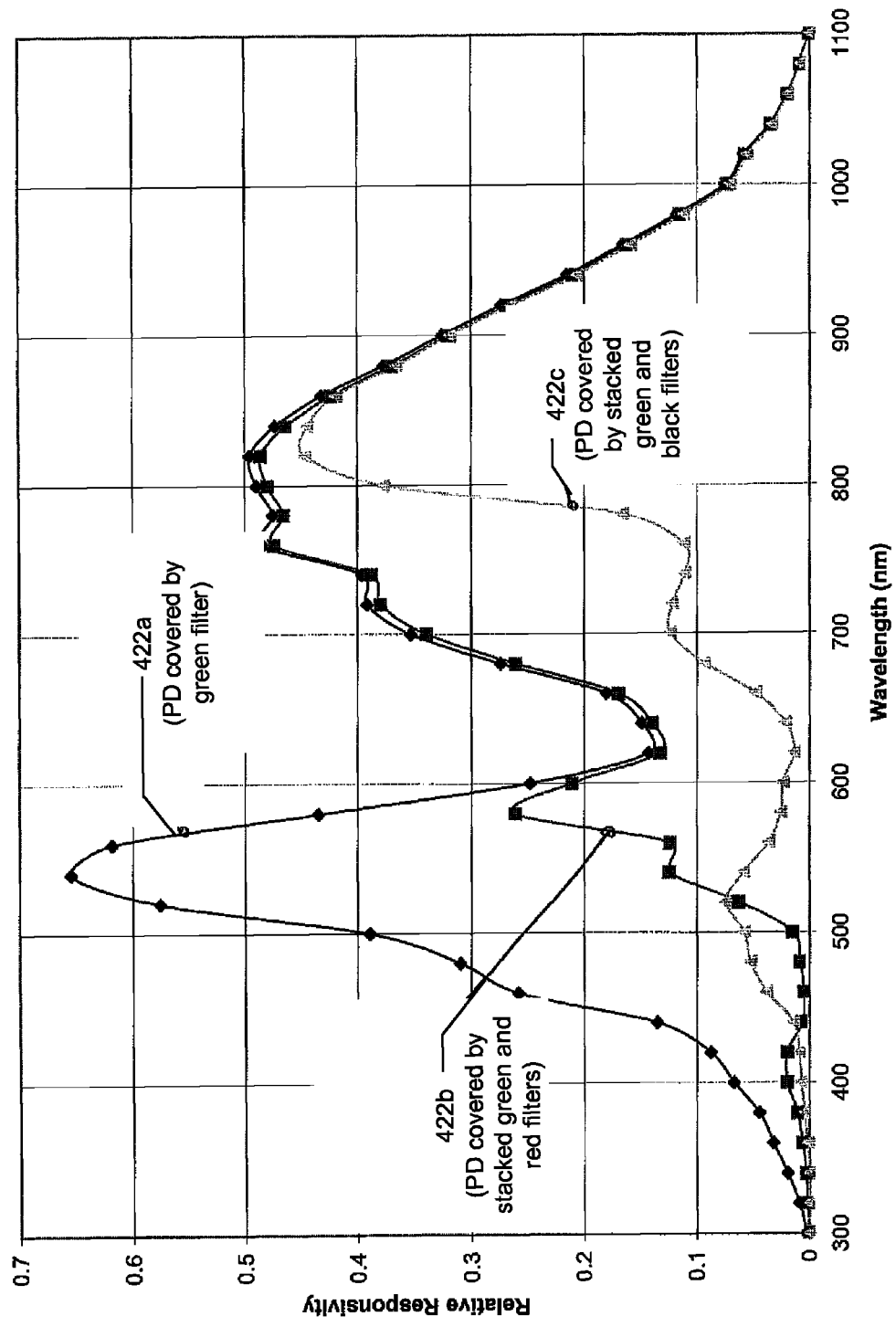
FIG. 4B is a graph that shows the spectral response of a human eye and the spectral responses of the three CMOS light sensors of FIG. 4A.

FIG. 4B shows the simulated responsivity of three different sensors by using the approximate Equations 2, 3 and 4 below.

$$R\lambda(\text{sensor 402a}) = R\lambda(\text{photo diode}) * Tr,\lambda(\text{green}) \quad \text{(Eq. 2)}$$

$$R\lambda(\text{sensor 402b}) = R\lambda(\text{photo diode}) * Tr,\lambda(\text{green}) * Tr,\lambda(\text{red}) \quad \text{(Eq. 3)}$$

$$R\lambda(\text{sensor 402c}) = R\lambda(\text{photo diode}) * Tr,\lambda(\text{green}) * Tr,\lambda(\text{black}) \quad \text{(Eq. 4)}$$

Referring to FIG. 4B, curve 422a illustrates the simulated response of first sensor 402a, which is a standard CMOS photocell (similar to 102) covered by a green filter 410. Curve 422b illustrates the simulated response of the second sensor 402b, which is a CMOS photocell (similar to 102) that is covered by both a green filter layer 410 and a red filter layer 412 stacked above one another. Curve 422c is a simulated spectral response of the third sensor 402c, which is a CMOS photocell (similar to 102) that is covered by both a green filter layer 410 and a black filter layer 414 stacked above one another. As will be discussed below, the weak visible-light response and strong IR response of the sensors 402b and 402c can be used to compensate for the IR response of the sensor 402a.

Stacking the colored filter layers provides a product of the transmisivity, as can be appreciated from Equations 3 and 4 above. Since responses of stacked filters are multiplicative, as shown in Equations 3 and 4, the order of stacked filter layers does not matter. Further, such stacking provides a natural scaling of the IR light (and/or other light to be subtracted out) prior to performing a subtraction to get a desired differential response. For a simplified example, assume a red filter passes 100% of IR light and 0% visible light, and a green filter passes 80% of IR light and 100% of visible light. Also assume that the output of a CMOS photocell only covered by the red filter were subtracted from the output of a CMOS photocell only covered by the green filter. The result of the subtraction would be −20% of the IR light and 100% of visible light, resulting in a negative IR light response. By stacking a red filter above (or below) the green filter, the result of the subtraction would be 0% IR light and 100% of visible light. More specifically, the output of the green filter covered photocell would include 80% of IR light and 100% of visible light; and the output of the photocell covered by the stacked green and red filters would include 80% of the IR light; with a difference between the two being 0% IR light and 100% visible light. This is a simplified example, because the transmisivity of colored filters layers are more complex than used in the above assumptions, as can be appreciated from FIG. 2 (e.g., a red filter layer does let some visible light pass), and the following discussions.

In FIG. 4A, the green filter layer 410 that covers the three CMOS photocells (formed by the three P/N junctions shown) is shown as being continuous. However, the green filter layer 410 can alternatively be discontinuous, e.g., the green filter layer covering one CMOS photocell may not contact (i.e., can be separate from) the green filter layer covering an adjacent CMOS photocell. Similarly, where two adjacent CMOS photocells are both to be covered by a red (or black) colored filter layer, the red (or black) filter layer covering the adjacent CMOS photocells can be continuous, or separated from one another. Regardless of whether a colored filter layer covering separate CMOS photocells is continuous or discontinuous, it can be said that both CMOS photocells are covered by a filter layer of the same color.

Figure 5A:
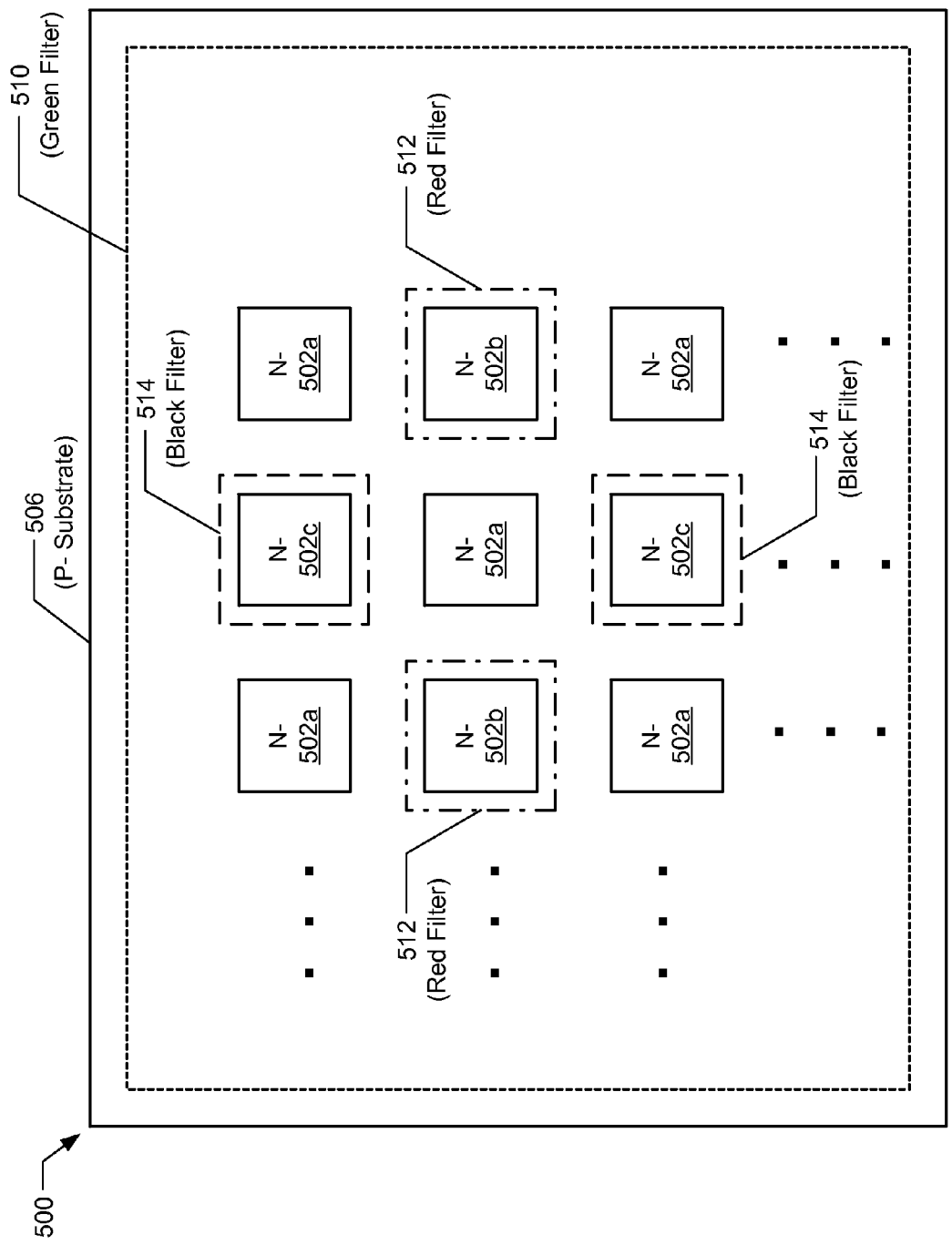
FIG. 5A shows the structure of a photo diode array including the three types of inter-digitized sensors (where two of the types of inter-digitized sensors can connected together as a single sensor, in accordance with an embodiment).

FIG. 5A shows the structure of a photo diode array 500 including the three types of inter-digitized sensors. The first sensor has X photo diode cells 502a covered by a green filter layer 510; the second sensor has Y photo diode cells 502b covered by the stacked green and red filter layers 510 and 512; and the third sensor has Z photo diode cells 502c covered by the stacked green and black filter layers 510 and 514. In a specific embodiment the photocurrents produced by the second and third sensors are added together, and then subtracted from the photocurrent produced by the first sensor, to provide a differential response. Accordingly, in such an embodiment, the Y photo diode cells 502b covered by the stacked green and red filters 510 and 512 and the Z photo diode cells 502c covered by the stacked green and black filters 510 and 514 can collectively be considered a "second sensor". More specifically, in FIG. 5A, the X photocells 502a can be connected together to produce a first photocurrent; and the Y photocells 502b and Z photocells 502c can be connected together to produce a second photocurrent. A difference between such photocurrents provides a differential photocurrent, having a differential response, as will be appreciated from FIG. 5B discussed below.

Figure 5B:
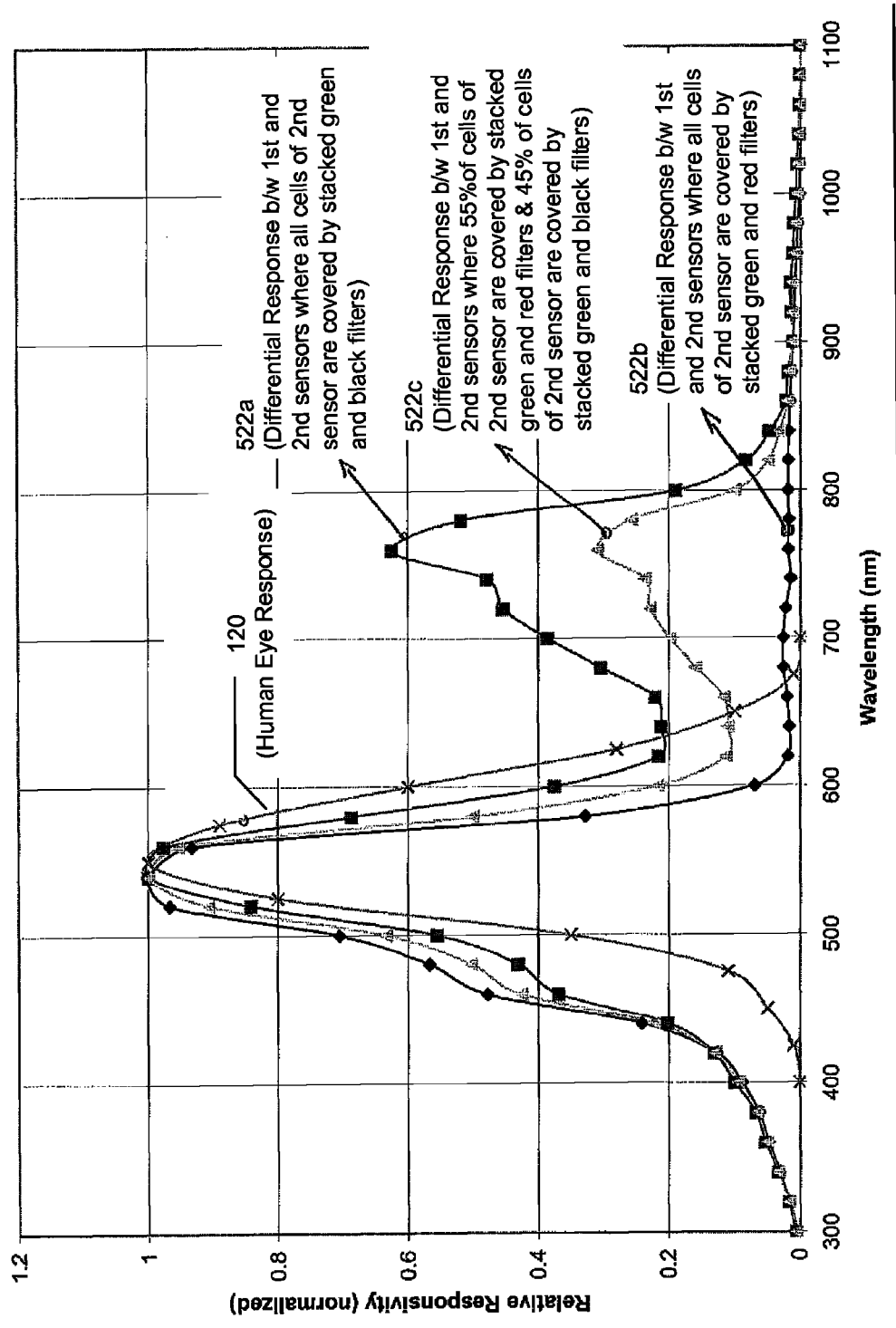
FIG. 5B shows the simulated differential responsivity between two sensors of FIG. 5A.

In accordance with specific embodiments, X=Y+Z. For simplicity, X can be 100. The inter-digitized structure 500 can be used to obtain better matching between the first and second sensors. In accordance with specific embodiments, each photo diode cell 502 has a size of ~25 um by 25 um, to reduce the sensors spectrum's angle sensitivity. FIG. 5B shows the simulated differential responsivity between the first and second sensors. More specifically, each sensor produces a photocurrent, which has a spectral response, i.e., the first sensor produces a first photocurrent, and the second sensor produces a second photocurrent. A differential photocurrent can be produced by determining a difference between the first and second photocurrents. For an ambient light detector, the desire is that the differential response is similar to the spectral response of the human eye. In FIG. 5B, curve 522a shows the differential response where all the cells of the first sensor are covered by a green filter layer, and all the cells of the second sensor are covered by the stacked green and black filter layers. Curve 522b shows the differential response where all the cells of the first sensor are covered by a green filter layer, and all the cells of the second sensor are covered by the stacked green and red filter layers. Curve 522c shows the differential response where all the cells of the first sensor are covered by a green filter layer, 55% of the cells of the second filter are covered by stacked green and red filter layers, and 45% of the cells of the second filter are covered by stacked green and black filter layers.

As can be appreciated from FIG. 5B, the differential response illustrated by curve 522c is the closest of the three curves (522a, 522b and 522c) to the human eye response curve 120. Nevertheless, the differential response can be further optimized. More generally, in accordance with embodiments of the present invention, by adjusting the number of the cells covered by the stacked green and red filter layers to the cells covered by the stacked green and black filter layers for the second sensor, the differential responsivity between the first and second sensors can be optimized to provide the visible spectrum close to the human eye response with good IR rejection. In this manner, the differential responsivity provides a means for better accuracy and less variation in ambient light measurement when ambient environment varies from indoor fluorescent, incandescent, or halogen lights to outdoor sunlight.

Figure 5C:
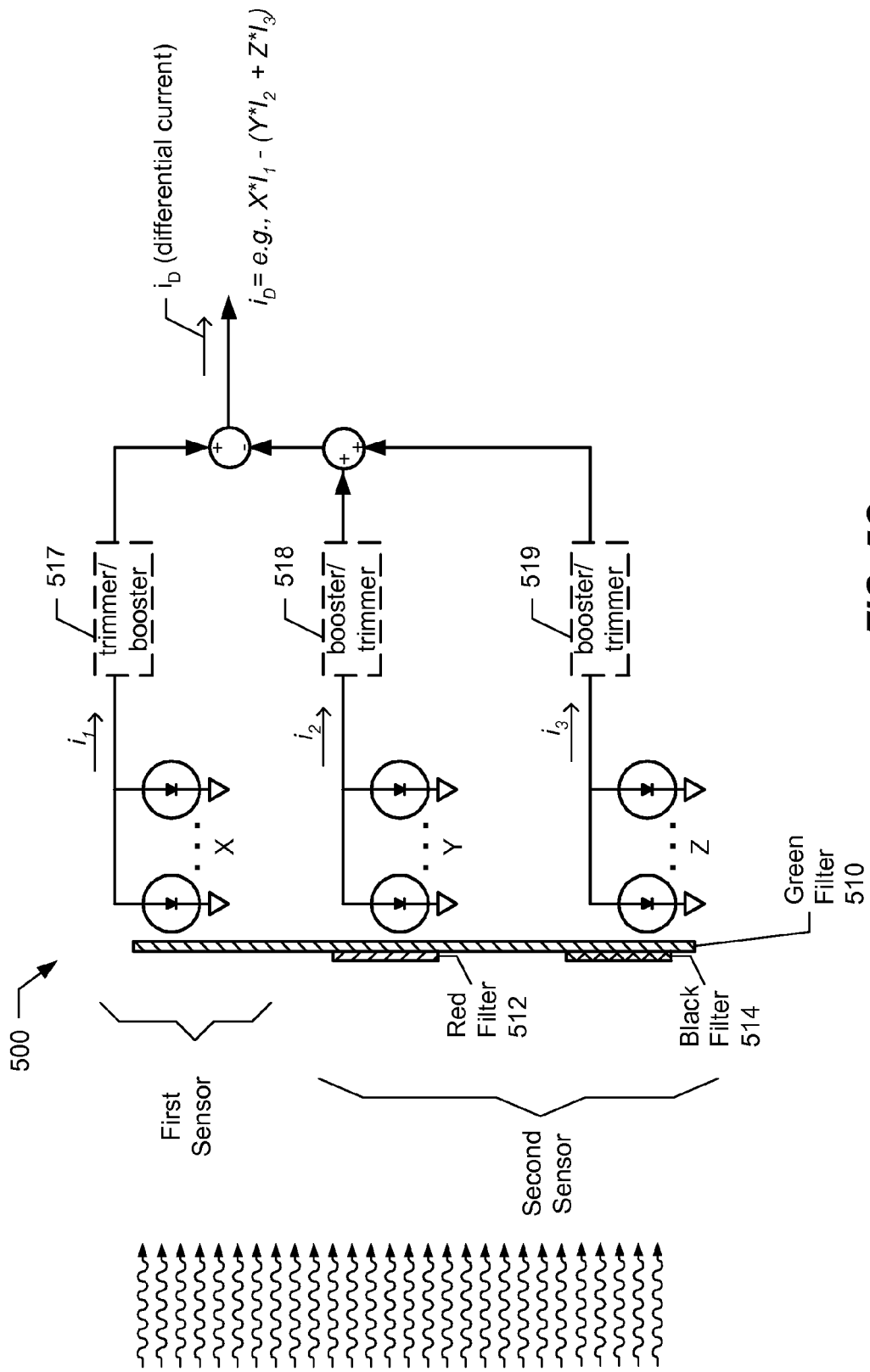
FIG. 5C is a high level circuit diagram that illustrates how various current can be combined to produce a desired differential current that has a desired differential response.

For completeness, FIG. 5C illustrates how the various currents can be combined to get a desired differential current ($i_D$), which has a desired spectral response. If desired, it is possible to use boosting or trimming circuits 517, 518 and 519, to adjust weighting. More generally, it is also within the scope of specific embodiments of the present invention that different weighting factors can be used when determining a difference between the photocurrents generated by the first and second sensors. However, it is believed that it is preferred to perform weighting type adjustments by adjusting how many cells have a specific type of filter structure covering them.

It is also believed, and within the scope of specific embodiments of the present invention, that the performance of the differential responsivity can be improved further by adjusting the thickness of one or more of the filters. Such adjustments to colored filter layer thicknesses are especially useful where the desire is to filter out greater quantities of a specific wavelength. For example, referring back to FIG. 2, by increasing the thickness of the black filter layer, the magnitude of the transmittance peaks at about 590 nm and 695 nm can be reduced.

It is also within the scope of specific embodiments of the present invention to use alternative and/or additional filters of other colors, such as blue filters, which are also available at the backend of a CMOS process, to produce further variations of CMOS photocells covered by stacked colored filters.

Figure 1A:
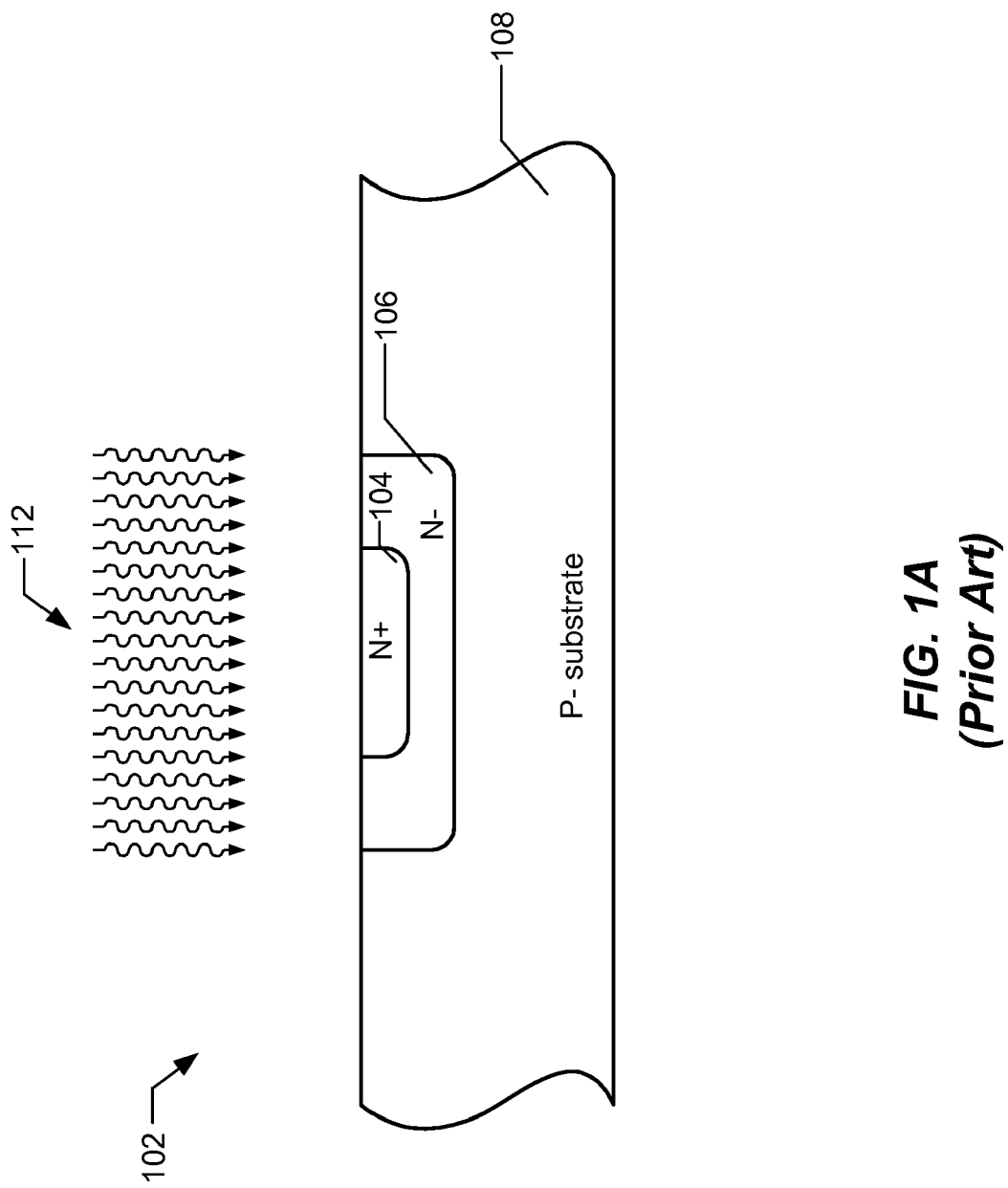
FIG. 1A is a cross section of a conventional CMOS light sensor.
Figure 1B:
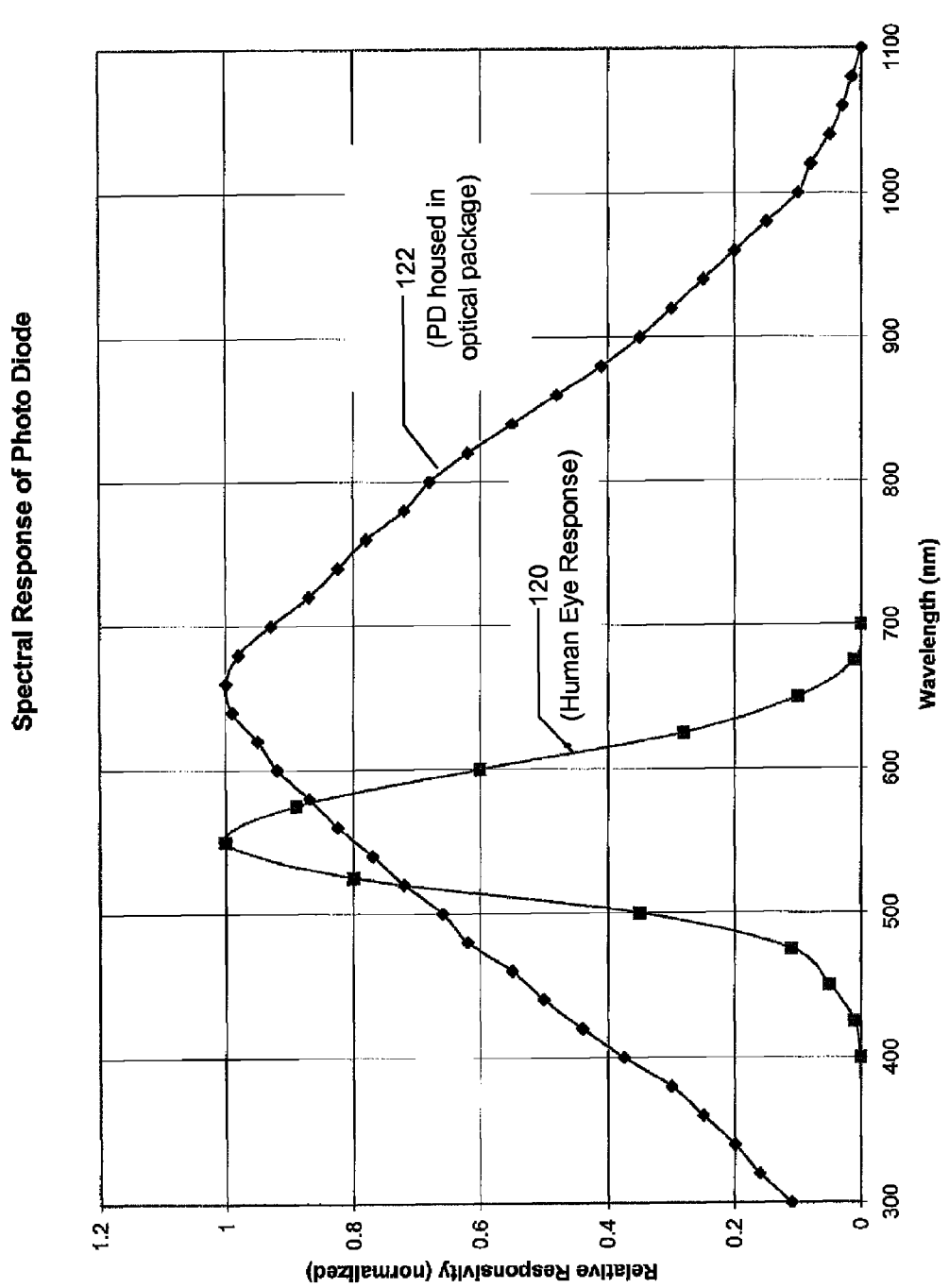
FIG. 1B is a graph that shows the spectral response of a human eye and the spectral response of the conventional CMOS light sensor.

In FIGS. 1A, 3A and 4A, each CMOS photocell was shown as including a $P^-/N^-$ junction. However, it is noted that alternative CMOS photocell structures can be used, and are within the scope of the present invention. For example, a CMOS photocell can include an $N^+$ region within an P-region, which provides a $P^-/N^+$ junction. It is also possible to swap N-type regions and P-type regions. These are just a few possibilities, which are not meant to be limiting.

Specific embodiments of the present invention described above are directed to ambient light detectors that include CMOS photocells, some of which are covered by a green filter layer, some of which are covered by stacked green and red filter layers, and some of which are covered by stacked green and black filter layers. However, it is noted that certain embodiments of the present invention are directed more generally to light sensors that include CMOS photocell(s) covered by stacked filters of different colors.

In the specific embodiments described above, some of the CMOS photocells are shown as being covered by stacked layers of colored filters, where one filter layer is green, and the other filter layer is black or red. In alternative embodiments of the present invention, stacked filter layers of other colors can be used, depending on the desired spectral response. For example, if the purpose of a light detector is to detect whether rain is present on a windshield of a car, a different spectral response may be desired, which may be achieved using stacked filter layers of other colors than just green, red and black. That is, additional and/or alternatively colored filter layers may also be used, in accordance with embodiments of the present invention. It is also within the scope of the present invention to stack more than two colored filter layers. For example, three or more different colored filtered layers can be stacked one above the other, in any order, where appropriate. As explained above, stacking of colored filters provides for a natural scaling prior to a subtraction that is used to get a desired differential response.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. It is intended that the scope of the invention be defined by the following claims and their equivalents.

What is claimed:

1. A light detector to detect light within a first range of wavelengths, comprising:
    a first sensor including complementary-metal-oxide semiconductor (CMOS) photocells that are covered by a colored filter layer of a first color that has a first transmittance that allows both light within the first range of wavelengths and light outside the first range of wavelengths to pass; and a second sensor including further CMOS photocells, which include both a first group of CMOS photocells and a second group of CMOS photocells, wherein the first group of the CMOS photocells of the second sensor are covered by both a colored filter layer of the first color and a colored filter layer of a second color, stacked one above the other in either order, where the colored filter layer of the second color has a second transmittance that allows at least a first portion of the light outside the first range of wavelengths to pass, and wherein the second group of the CMOS photocells of the second sensor are covered by both a colored filter layer of the first color and a colored filter layer of a third color, stacked one above the other in either order, where the colored filter layer of the third color has a third transmittance that allows at least a second portion of the light outside the first range of wavelengths to pass; and wherein the CMOS photocells of the first sensor are not covered by a colored filter layer of the second color;

wherein the CMOS photocells of the first sensor are not covered by a colored filter layer of the third color;

wherein the first group of the CMOS photocells of the second sensor are not covered by the colored filter layer of the third color;

wherein the second group of the CMOS photocells of the second sensor are not covered by the colored filter layer of the second color;

wherein when light both within the first range of wavelengths and outside the first range of wavelengths is incident upon the detector the first sensor, which includes CMOS photocells that are covered by the colored filter layer of the first color, produces a first photocurrent ($i_1$), the first group of the CMOS photocells of the second sensor, which are covered by both the colored filter layer of the first color and the colored filter layer of the second color, produce a second photocurrent ($i_2$), and the second group of the CMOS photocells of the second sensor, which are covered by both the colored filter layer of the first color and the colored filter layer of the third color, produce a third photocurrent ($i_3$); and further comprising circuitry configured to receive the first photocurrent ($i_1$), the second photocurrent ($i_2$) and the third photocurrent ($i_3$), and configured to produce a differential photocurrent indicative of a difference between the first photocurrent and a summation of the second and third photocurrents, wherein the differential photocurrent has a spectral response with at least a majority of the light outside the first range of wavelengths cancelled.

2. The detector of claim 1, wherein the colored filter layers are deposited over the CMOS photocells.

3. The light detector of claim 1, wherein:
light within the first range of wavelengths includes visible light wavelengths; and
light outside the first range of wavelengths includes infrared (IR) light wavelengths.

4. The detector of claim 1, wherein:
the first color is green;
the second color is red; and
the third color is black.

5. A light detector to detect light within a first range of wavelengths, comprising:

a first sensor including complementary-metal-oxide semiconductor (CMOS) photocells that are covered by a colored filter layer of a first color that has a first transmittance that allows both light within the first range of wavelengths and light outside the first range of wavelengths to pass; and a second sensor including further CMOS photocells, which include both a first group of CMOS photocells and a second group of CMOS photocells, wherein the first group of the CMOS photocells of the second sensor are covered by both a colored filter layer of the first color and a colored filter layer of a second color, stacked one above the other in either order, where the colored filter layer of the second color has a second transmittance that allows at least a first portion of the light outside the first range of wavelengths to pass, and wherein the second group of the CMOS photocells of the second sensor are covered by both a colored filter layer of the first color and a colored filter layer of a third color, stacked one above the other in either order, where the colored filter layer of the third color has a third transmittance that allows at least a second portion of the light outside the first range of wavelengths to pass;

wherein the CMOS photocells of the first sensor are not covered by a colored filter layer of the second color;

wherein the CMOS photocells of the first sensor are not covered by a colored filter layer of the third color;

wherein the first group of the CMOS photocells of the second sensor are not covered by the colored filter layer of the third color;

wherein the second group of the CMOS photocells of the second sensor are not covered by the colored filter layer of the second color;

wherein the first sensor produces a first photocurrent, and the second sensor produces a second photocurrent, when light both within the first range of wavelengths and outside the first range of wavelengths is incident upon the detector;

wherein a differential photocurrent, produced by determining a difference between the first and second photocurrents, has a spectral response with at least a majority of the light outside the first range of wavelengths cancelled;

wherein the colored filter layer of the first color comprises a green filter layer;

wherein the colored filter layer of the second color comprises a red filter layer;

wherein the colored filter layer of the third color comprises a black filter layer;

wherein the first sensor, which includes CMOS photocells that are covered by the green filter layer, detects both visible light wavelengths and infrared (IR) light wavelengths; and wherein the second sensor, which includes the first group of CMOS photocells that are covered by both the green filter layer and the red filter layer stacked one above the other in either order, and the second group of CMOS photocells that are covered by the green filter layer and the black filter layer stacked one above the other in either order, primarily detects IR light wavelengths.

6. The light detector of claim 5, wherein:
the green filter layer has a first thickness;
the red filter layer has a second thickness;
the black filter layer has a third thickness; and
the first, second and third thicknesses are selected such that the spectral response of the differential photocurrent is from about 400 nm to about 700 nm with a peak response at about 550 nm, which is substantially similar to a known spectral response of a human eye.

7. An ambient light detector, comprising:
a first sensor including complementary-metal-oxide semiconductor (CMOS) photocells that are covered by a colored filter layer of a first color that allows both visible and infrared (IR) light to pass; and
a second sensor including further CMOS photocells, which include both a first group of CMOS photocells and a second group of CMOS photocells,
  wherein the first group of the CMOS photocells of the second sensor are covered by both a colored filter layer of the first color and a colored filter layer of a second color, stacked one above the other in either order, where the colored filter layer of the second color allows at least a first portion of IR light to pass, and
  wherein the second group of the CMOS photocells of the second sensor are covered by both a colored filter layer of the first color and a colored filter layer of a third color, stacked one above the other in either order, where the colored filter layer of the third color allows at least a second portion of IR light to pass;
wherein the CMOS photocells of the first sensor are not covered by a colored filter layer of the second color;
wherein the CMOS photocells of the first sensor are not covered by a colored filter layer of the third color;
wherein the first group of the CMOS photocells of the second sensor are not covered by the colored filter layer of the third color;
wherein the second group of the CMOS photocells of the second sensor are not covered by the colored filter layer of the second color;
wherein when light including both visible and IR light is incident upon the detector
  the first sensor, which includes CMOS photocells that are covered by the colored filter layer of the first color, produces a first photocurrent ($i_1$),
  the first group of the CMOS photocells of the second sensor, which are covered by both the colored filter layer of the first color and the colored filter layer of the second color, produce a second photocurrent ($i_2$), and
  the second group of the CMOS photocells of the second sensor, which are covered by both the colored filter layer of the first color and the colored filter layer of the third color, produce a third photocurrent ($i_3$); and
further comprising circuitry configured to receive the first photocurrent ($i_1$), the second photocurrent ($i_2$) and the third photocurrent ($i_3$), and configured to produce a differential photocurrent indicative of a difference between the first photocurrent and a summation of the second and third photocurrents, wherein the differential photocurrent has a spectral response with at least a significant part of the IR light cancelled.

8. The detector of claim 7, wherein the colored filter layers are deposited over the CMOS photocells.

9. The detector of claim 7, wherein:
the filter layer of the first color has a first thickness;
the filter layer of the second color has a second thickness;
the filter layer of the third color has a third thickness; and
the first, second and third thicknesses are selected such that the spectral response of the differential photocurrent is from about 400 nm to about 700 nm with a peak response at about 550 nm, which is substantially similar to a known spectral response of a human eye.

10. An ambient light detector, comprising:
a first sensor including complementary-metal-oxide semiconductor (CMOS) photocells that are covered by a colored filter layer of a first color that allows both visible and infrared (IR) light to pass; and
a second sensor including further CMOS photocells, which include both a first group of CMOS photocells and a second group of CMOS photocells,
  wherein the first group of the CMOS photocells of the second sensor are covered by both a colored filter layer of the first color and a colored filter layer of a second color, stacked one above the other in either order, where the colored filter layer of the second color allows at least a first portion of IR light to pass, and
  wherein the second group of the CMOS photocells of the second sensor are covered by both a colored filter layer of the first color and a colored filter layer of a third color, stacked one above the other in either order, where the colored filter layer of the third color allows at least a second portion of IR light to pass;
wherein the CMOS photocells of the first sensor are not covered by a colored filter layer of the second color;
wherein the CMOS photocells of the first sensor are not covered by a colored filter layer of the third color;
wherein the first group of the CMOS photocells of the second sensor are not covered by the colored filter layer of the third color;
wherein the second group of the CMOS photocells of the second sensor are not covered by the colored filter layer of the second color;
wherein the first sensor produces a first photocurrent, and the second sensor produces a second photocurrent, when light including both visible and IR light is incident upon the detector;
wherein a differential photocurrent, produced by determining a difference between the first and second photocurrents, has a spectral response with at least a significant part of the IR light cancelled;
wherein the first color is green;
wherein the second color is red; and
wherein the third color is black.

11. The detector of claim 10, wherein:
the green filter layer has a first thickness;
the red filter layer has a second thickness;
the black filter layer has a third thickness; and
the first, second and third thicknesses are selected such that the spectral response of the differential photocurrent is from about 400 nm to about 700 nm with a peak response at about 550 nm, which is substantially similar to a known spectral response of a human eye.

12. The detector of claim 10, wherein:
X of the CMOS photocells are covered by the green filter layer, but no other colored filter layer, X being indicative of the percentage of CMOS photocells of the detector that are in the first sensor;
Y of the CMOS photocells are covered by both the green filter layer and the red filter layer, Y being indicative of the percentage of CMOS photocells of the detector that are in the first group of CMOS photocells of the second sensor;
Z of the CMOS photocells are covered by both the green filter layer and the black filter layer, Z being indicative of the percentage of CMOS photocells of the detector that are in the second group of CMOS photocells of the second sensor; and X, Y and Z are selected such that the spectral response of the differential photocurrent is from about 400 nm to about 700 nm with a peak response at about 550 nm, which is substantially similar to a known spectral response of a human eye.

13. An ambient light detector, comprising:

a first sensor including complementary-metal-oxide semiconductor (CMOS) photocells that are covered by a colored filter layer of a first color that allows both visible and infrared (IR) light to pass; and a second sensor including further CMOS photocells, which include both a first group of CMOS photocells and a second group of CMOS photocells, wherein the first group of the CMOS photocells of the second sensor are covered by both a colored filter layer of the first color and a colored filter layer of a second color, stacked one above the other in either order, where the colored filter layer of the second color allows at least a first portion of IR light to pass, and wherein the second group of the CMOS photocells of the second sensor are covered by both a colored filter layer of the first color and a colored filter layer of a third color, stacked one above the other in either order, where the colored filter layer of the third color allows at least a second portion of IR light to pass;

wherein the CMOS photocells of the first sensor are not covered by a colored filter layer of the second color;

wherein the CMOS photocells of the first sensor are not covered by a colored filter layer of the third color;

wherein the first group of the CMOS photocells of the second sensor are not covered by the colored filter layer of the third color;

wherein the second group of the CMOS photocells of the second sensor are not covered by the colored filter layer of the second color;

wherein the first sensor produces a first photocurrent, and the second sensor produces a second photocurrent, when light including both visible and IR light is incident upon the detector;

wherein a differential photocurrent, produced by determining a difference between the first and second photocurrents, has a spectral response with at least a significant part of the IR light cancelled;

wherein the first sensor includes X CMOS photocells that are covered by the filter layer of the first color, but no other colored filter layer;

wherein the second sensor includes

Y CMOS photocells that are covered by both the filter layer of the first color and the filter layer of the second color; and Z CMOS photocells that are covered by both the filter layer of the first color and the filter layer of the third color; and wherein X, Y and Z are selected such that the spectral response of the differential photocurrent is from about 400 nm to about 700 nm with a peak response at about 550 nm, which is substantially similar to a known spectral response of a human eye.

14. An ambient light detector, comprising:

a first sensor including complementary-metal-oxide semiconductor (CMOS) photocells that are covered by a colored filter layer of a first color that allows both visible and infrared (IR) light to pass; and a second sensor including further CMOS photocells, which include both a first group of CMOS photocells and a second group of CMOS photocells, wherein the first group of the CMOS photocells of the second sensor are covered by both a colored filter layer of the first color and a colored filter layer of a second color, stacked one above the other in either order, where the colored filter layer of the second color allows at least a first portion of IR light to pass, and wherein the second group of the CMOS photocells of the second sensor are covered by both a colored filter layer of the first color and a colored filter layer of a third color, stacked one above the other in either order, where the colored filter layer of the third color allows at least a second portion of IR light to pass;

wherein the CMOS photocells of the first sensor are not covered by a colored filter layer of the second color;

wherein the CMOS photocells of the first sensor are not covered by a colored filter layer of the third color;

wherein the first group of the CMOS photocells of the second sensor are not covered by the colored filter layer of the third color;

wherein the second group of the CMOS photocells of the second sensor are not covered by the colored filter layer of the second color;

wherein the first sensor produces a first photocurrent, and the second sensor produces a second photocurrent, when light including both visible and IR light is incident upon the detector;

wherein a differential photocurrent, produced by determining a difference between the first and second photocurrents, has a spectral response with at least a significant part of the IR light cancelled;

wherein the filter layer of the first color has a first thickness;

wherein the filter layer of the second color has a second thickness;

the filter layer of the third color has a third thickness; and wherein the first sensor includes X CMOS photocells that are covered by the filter layer of the first color, but no other colored filter layer;

wherein the second sensor includes

Y CMOS photocells that are covered by both the filter layer of the first color and the filter layer of the second color, and Z CMOS photocells that are covered by both the filter layer of the first color and the filter layer of the third color; and wherein the first, second and third thicknesses, and X, Y and Z, are selected such that the spectral response of the differential photocurrent is from about 400 nm to about 700 nm with a peak response at about 550 nm, which is substantially similar to a known spectral response of a human eye.

\* \* \* \* \*